US005843840A

United States Patent [19]

Miyazaki et al.

[11] Patent Number: 5,843,840

[45] Date of Patent: Dec. 1, 1998

[54] SEMICONDUCTOR DEVICE HAVING A WIRING LAYER AND METHOD FOR MANUFACTURING SAME

[75] Inventors: Kazuki Miyazaki; Kazunobu Shigehara; Masanobu Zenke, all of Tokyo, Japan

[73] Assignee: NEC Corporation, Tokyo, Japan

[21] Appl. No.: 610,349

[22] Filed: Mar. 4, 1996

[30] Foreign Application Priority Data

Mar. 3, 1995 [JP] Japan .................................... 7-044613

[51] Int. Cl.[6] .................................................... H01L 21/28

[52] U.S. Cl. .......................... 438/659; 438/660; 438/656; 438/672; 438/685

[58] Field of Search .................................... 438/659, 660, 438/656, 672, 685

[56] References Cited

U.S. PATENT DOCUMENTS

| | | | |
|---|---|---|---|
| 4,502,206 | 3/1985 | Schnable et al. | 438/659 |
| 4,704,367 | 11/1987 | Alvis et al. | 438/660 |
| 4,751,101 | 6/1988 | Joshi et al. | 438/685 |
| 4,777,150 | 10/1988 | Deneuville et al. | 438/659 |
| 4,942,138 | 7/1990 | Miki | 438/659 |
| 5,182,231 | 1/1993 | Hongo et al. . | |
| 5,188,706 | 2/1993 | Hori et al. | 156/643 |
| 5,427,982 | 6/1995 | Jun | 437/195 |
| 5,472,896 | 12/1995 | Chen et al. | 437/44 |
| 5,668,055 | 9/1997 | Xu et al. | 438/660 |
| 5,712,207 | 1/1998 | Lee et al. | 438/660 |

FOREIGN PATENT DOCUMENTS

| | | |
|---|---|---|
| 245 627 | 11/1987 | European Pat. Off. . |
| 289 274 | 11/1988 | European Pat. Off. . |
| 326 217 | 8/1989 | European Pat. Off. . |

OTHER PUBLICATIONS

Thomas E. Clark, et al. "High Pressure Blanket CVD Tungsten," Solid State Technology Japanese Edition, Dec., 1989.

*Primary Examiner*—Jey Tsai
*Assistant Examiner*—Thomas G. Bilodeau
*Attorney, Agent, or Firm*—Whitham, Curtis & Whitham

[57] ABSTRACT

In a semiconductor device having a metal wiring conductor connected to a contact hole formed through an interlayer insulator layer formed on a lower level circuit, a lower level tungsten film is deposited under a condition giving an excellent step coverage so as to fill the contact hole, and an upper level tungsten film is further deposited under a condition of forming a film having a stress smaller than that of the lower level tungsten film. The metal wiring conductor is formed of a double layer which is composed of the lower level tungsten film and the upper level tungsten film, and therefore, has a reduced stress in the whole of the film. Thus, there is obtained the tungsten film wiring conductor which fills the inside of the contact hole with no void and therefore has a high reliability, and which has a low film stress. In addition, the number of steps in the manufacturing process can be reduced.

4 Claims, 13 Drawing Sheets

4 TUNGSTEN FILM
3 ADHESION LAYER
2 SILICON OXIDE
1 SILICON SUBSTRATE

ION IMPLANTATION
4 TUNGSTEN FILM
3 ADHESION LAYER
2 SILICON OXIDE
1 SILICON SUBSTRATE

6 WIRING CONDUCTOR
3 ADHESION LAYER
2 SILICON OXIDE
1 SILICON SUBSTRATE

SEMICONDUCTOR DEVICE HAVING A WIRING LAYER AND METHOD FOR MANUFACTURING SAME

BACKGROUND OF THE INVENTION

1. Field of the invention

The present invention relates to a semiconductor device and a method for manufacturing the same, and more specifically to a semiconductor device having a metal wiring layer and a method for manufacturing the same.

2. Description of related art

First, one example of the prior art will be described. As a technology for filling a connection hole such as a fine contact hole or a fine via-hole for interconnecting wiring conductors of different levels, a blanket tungsten chemical vapor deposition (blanket WCVD) has been reduced into practice, which is excellent in step coverage and low in resistance. In this blanket WCVD method, after a blanket tungsten film is formed, the blanket tungsten film is etched back by a dry etching so that the tungsten film of only a plug is caused to remain, and then, a film of a metal such as aluminum is formed thereon, and patterned to form a patterned wiring conductor.

Recently, a method has been proposed in which a wiring conductor itself is formed of the tungsten film, in order to omit the step of etching back the tungsten film. Now, this method will be described with reference to FIGS. 1A to 1D.

First, as shown in FIG. 1A, a silicon oxide film 2 is formed on silicon substrate 1, and a contact hole is formed in the silicon oxide film 2. An adhesion layer 3 is deposited in the contact hole by a sputtering. The adhesion layer 3 is suitable to be formed of a double layer of composed of a titanium (Ti) film and a titanium nitride (TiN) film. Then, a tungsten film 4 is deposited by a chemical vapor deposition (CVD), as shown in FIG. 1B. Furthermore, a photoresist pattern 5 for a possible wiring conductor is formed by a lithography, as shown in FIG. 1C.

The tungsten film 4 is etched by a dry etching using the photoresist pattern 5 as a mask, so that a desired wiring conductor 6 is completed as shown in FIG. 1D.

Next, another example of the prior art will be described. In a semiconductor device having an upper level metal wiring conductor and a lower level metal wiring conductor which are separated by an interlayer insulator film such as a silicon oxide film but which are interconnected through a contact hole formed by selectively etching the interlayer insulator film, it was a conventional practice of forming the metal wiring layers by a relatively simple and inexpensive sputtering. However, because a diameter of the contact holes has become small with advanced microminiaturization, a void occurs in the contact hole if the sputtering having a poor step coverage is used. A long-term reliability of the wiring conductor is deteriorated. Therefore, the metal wiring conductors have been formed by a chemical vapor deposition having an excellent step coverage, thereby to prevent generation of the void. However, if the metal wiring conductors are formed by the chemical vapor deposition, it is disadvantageous that a silicon wafer is bowed for an internal stress of the metal film, with the result that a suction failure often occurs in a next step performed in the same apparatus or in a vacuum suction robot feeding machine for feeding it to a next step.

In order to avoid the above problem, the conventional semiconductor device was formed as follows: As shown in FIG. 2A, an silicon oxide film 12 is formed on a silicon substrate 11 in which a desired circuit has been already formed. Then, a contact hole 13 is formed by selectively etching the silicon oxide film 12, and a refractory metal layer 14 is deposited on a surface including the contact hole 13, by a sputtering.

Thereafter, as shown in FIG. 2B, a tungsten film 15 is formed by a chemical vapor deposition using $WF_6$ and $H_2$ as a raw material, under a condition realizing an excellent step coverage, namely, a reaction rate controlling condition such as a $WF_6$ flow rate of 50 sccm to 100 sccm and a deposition temperature of 400° C. to 460° C.

Then, as shown in FIG. 2C, the tungsten film 15 is etched back so that the tungsten film 15 remains only in the inside of the contact hole 13 but the tungsten film 15 is completely removed from the upper surface of the refractory metal film 14 so as to expose the surface of the refractory metal film 14.

Furthermore, as shown in FIG. 2D, an aluminum layer 17 is deposited by a sputtering, and then, is patterned to form a wiring conductor composed of the refractory metal film 14 and the aluminum wiring layer 17 which are connected to a lower level circuit in the contact hole 13.

In the first example of the prior art as mentioned above, the tungsten film formed by the blanket WCVD is required to fill a fine contact hole having a diameter of not greater than 0.5 $\mu$m without occurrence of the void, and also to have a property which causes no problem in a process after the tungsten film deposition step. In the prior art, however, the tungsten film used for forming a tungsten plug can fill the fine contact hole with no void, but has the internal stress of $1\times10^{10}$ dyne/cm$^2$ or more, so that the wafer has a large bowing. Therefore, if the wiring conductors were formed of the tungsten film used for forming the tungsten plug, a problem is encountered in which, a feed trouble occurs in a feeding system of a semiconductor manufacturing machine for feeding it to a process after the tungsten film deposition step, particularly, a lithography step for forming the wiring pattern.

In order to lower the stress of the tungsten film, it is a general practice to form a film deposition under a supply rate controlling condition by lowering the $WF_6$ flow rate and/or by elevating the deposition or growth temperature.

As shown in FIGS. 3A and 3B, if the metal film were formed by changing the CVD film deposition condition of a tungsten film 16 to a condition for forming a film having a low internal stress, namely, to a supply rate controlling condition, the step coverage property is deteriorated, so that a void 18 occurs, and a problem such as a low long-term reliability of the wiring conductor and the others is generated.

As mentioned above, with the film deposition under the supply rate controlling condition, the step coverage of the tungsten film deteriorates, and it becomes difficult to fill a fine contact of not greater than 0.5 $\mu$m without generation of void.

Because of the above mentioned above, it was difficult to use the tungsten film for the wiring conductor having a fine contact.

In the second example of the prior art as mentioned above of the semiconductor device and the method for manufacturing the same, the manufacturing process becomes long and complicated, resulting in an increased manufacturing cost. In addition, in order to shorten the manufacturing process, if the metal wiring conductor is formed of a metal film formed by only the CVD process, there occurs the above mentioned problem caused by the high stress.

Thomas E. Clark, et al, “High Pressure Blanket CVD Tungsten”, Solid State Technology Japanese Edition, December 1989, pages 33–41 discloses a different WCVD process. However, the tungsten film formed in this process has a high internal stress, and therefore, cannot be used as the wiring conductor.

SUMMARY OF THE INVENTION

Accordingly, it is an object of the present invention to provide a semiconductor device and a method for manufacturing the same, which have overcome the above mentioned defects of the conventional ones.

Another object of the present invention is to provide a semiconductor device and a method for manufacturing the same, which have a tungsten plug and a tungsten wiring conductor, and which have a minimized wafer bowing and an excellent step coverage.

Still another object of the present invention is to provide a method for manufacturing a semiconductor device, which has a reduced number of manufacturing steps.

The above and other objects of the present invention are achieved in accordance with the present invention by a semiconductor device having a semiconductor substrate having a principal surface thereof, an interlayer insulator film formed on the principal surface of the semiconductor substrate, a contact hole formed through the interlayer insulator film to reach the principal surface, and a metal wiring conductor filling the contact hole to reach the principal surface and extending on the interlayer insulator film, the metal wiring conductor being formed of a lower level metal film having an excellent step coverage to fill the contact hole with no void, and an upper level metal film formed on the lower level metal film, the upper level metal film being formed of the same metal as that of the lower level metal film, and the upper level metal film having an internal stress smaller than that of the lower level metal film.

In one embodiment, the lower level metal film having an excellent step coverage has a film thickness not smaller than 40% of a diameter of the contact hole, and the remainder of a desired thickness is constituted of the upper level metal film having the internal stress smaller than that of the lower level metal film.

According to another aspect of the present invention, there is provided a method for forming a semiconductor device having a wiring conductor formed of tungsten, the method including the steps of forming a tungsten film by a low pressure chemical vapor deposition, injecting ions into the tungsten film, and patterning the ion-injected tungsten film so as to form a wiring conductor composed of the ion-injected tungsten film.

Preferably, the above method further includes the step of heat treating the ion-injected tungsten film before the patterning step. Furthermore, an internal stress of the tungsten film is reduced to a value not greater than $8\times10^9$ dyne/cm$^2$ by the ion injection and the heat treatment or only by the ion injection.

According to still another aspect of the present invention, there is provided a method for forming a semiconductor device having a semiconductor substrate a principal surface thereof, an interlayer insulator film formed on the principal surface of the semiconductor substrate, a contact hole formed through the interlayer insulator film to reach the principal surface, and a metal wiring conductor filling the contact hole to connect with the principal surface and extending on the interlayer insulator film, the method including the step of forming a lower level metal film having an excellent step coverage on the interlayer insulator film including an inside of the contact hole, and the step of forming on the lower level metal film an upper level metal film having an internal stress smaller than that of the lower level metal film.

Preferably, the lower level metal film having an excellent step coverage has a film thickness not smaller than 40% of a diameter of the contact hole, and the remainder of a desired thickness is constituted of the upper level metal film having the internal stress smaller than that of the lower level metal film.

In one embodiment, the lower level metal film and the upper level metal film are continuously formed.

In one preferred embodiment, the lower level metal film is formed by a chemical vapor deposition under a reaction rate controlling condition, and the upper level metal film is formed by a chemical vapor deposition under a supply rate controlling condition.

Specifically, the lower level metal film and the upper level metal film are formed of tungsten by a chemical vapor deposition while maintaining a deposition temperature at a constant value within a range of 400° C. to 500° C., but the lower level metal film is formed by controlling a $WF_6$ flow rate on the order of 50 sccm to 100 sccm and the upper level metal film is formed by controlling a $WF_6$ flow rate on the order of 10 sccm to 50 sccm.

Alternatively, the lower level metal film and the upper level metal film are formed of tungsten by a chemical vapor deposition while maintaining a $WF_6$ flow rate at a constant value within a range of 10 sccm to 100 sccm, but the lower level metal film is formed by controlling a deposition temperature on the order of 400° C. to 450° C., and the upper level metal film is formed by controlling a deposition temperature on the order of 450° C. to 500° C.

As still another embodiment, the lower level metal film is formed of tungsten by a chemical vapor deposition by controlling a deposition temperature on the order of 400° C. to 450° C. and by controlling a $WF_6$ flow rate on the order of 50 sccm to 100 sccm, and the upper level metal film is formed of tungsten by a chemical vapor deposition by controlling a deposition temperature on the order of 450° C. to 500° C. and by controlling a $WF_6$ flow rate on the order of 10 sccm to 50 sccm.

Moreover, the lower level metal film and the upper level metal film are continuously formed so as to control a stress of the whole of the lower and upper level metal films by changing a film thickness ratio between the lower level metal film and the upper level metal film.

The above and other objects, features and advantages of tie present invention will be apparent from the following description of preferred embodiments of the invention with reference to the accompanying drawings.

DESCRIPTION OF THE PREFERRED EMBODIMENTS

Referring to FIGS. 4A to 4D, there are shown diagrammatic sectional views of a semiconductor device, for illustrating a first embodiment of the process in accordance with the present invention for manufacturing a semiconductor device.

Figure 4A:
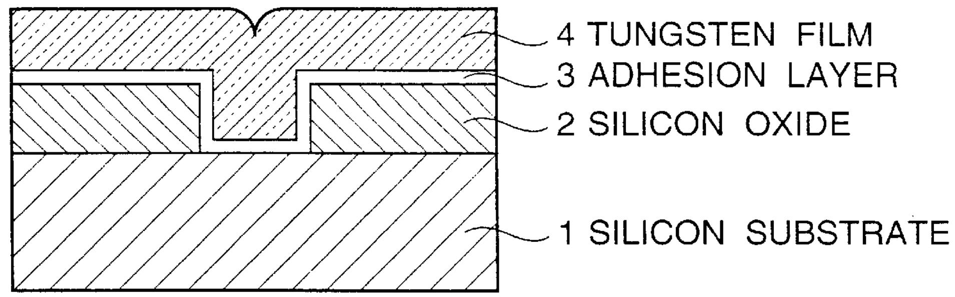
FIGS. 4A to 4D are diagrammatic sectional views of a semiconductor device, for illustrating a first embodiment of the process in accordance with the present invention for manufacturing a semiconductor device.
Figure 5:
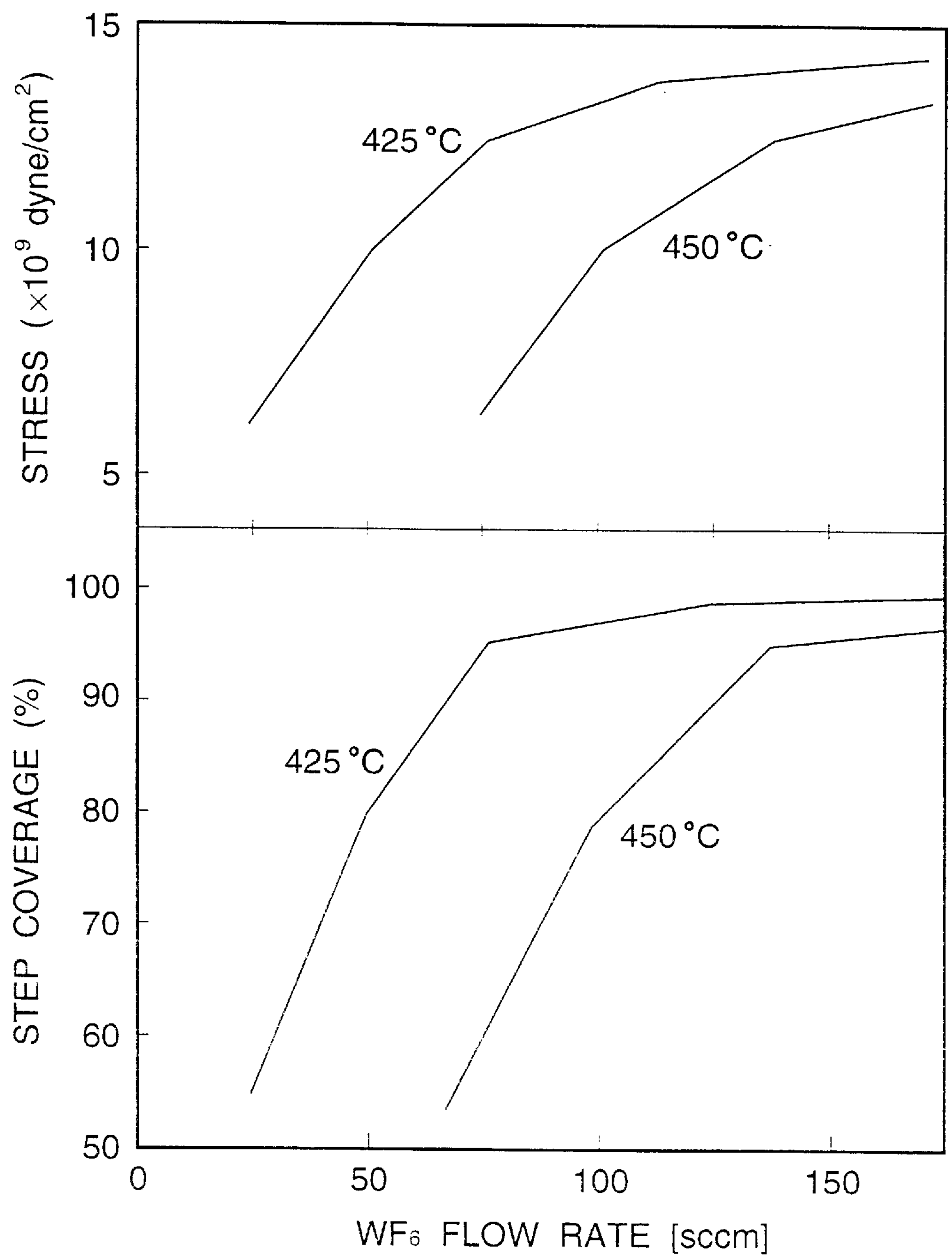
FIG. 5 is a graph illustrating a $WF_6$ flow rate dependency of the stress and the step coverage of the tungsten film.

As shown in FIG. 4A, after a silicon oxide film 2 having a thickness of 1,000 Å to 10,000 Å is formed on a silicon substrate 1, a contact hole is formed through the silicon oxide film by use of a lithography technology and a dry etching technology, and then, an adhesion layer 3 is formed in the contact hole by depositing a Ti film and a TiN film by sputtering. Each of the Ti film and the TiN film has a thickness on the order of 500 Å to 2,000 Å. Thereafter, a tungsten film 4 having a thickness of 3,000 Å to 7,000 Å is deposited on the adhesion layer 3 by a low pressure CVD process. At this time, the deposited tungsten film 4 is required to fill the contact hole with no void. For this purpose, the deposition condition is that the deposition temperature is on the order of 425° C. to 475° C. and the $WF_6$ flow rate on the order of 50 $cm^3$/min to 100 $cm^3$/min or more. FIG. 5 is a graph illustrating a $WF_6$ flow rate dependency of the stress and the step coverage of the tungsten film. If the tungsten film is deposited under a condition of forming a film having an excellent step coverage, namely, under a reaction rate controlling condition, the stress of the deposited tungsten film is $1.2\times10^{10}$ dyne/$cm^2$ or more.

Figure 4B:
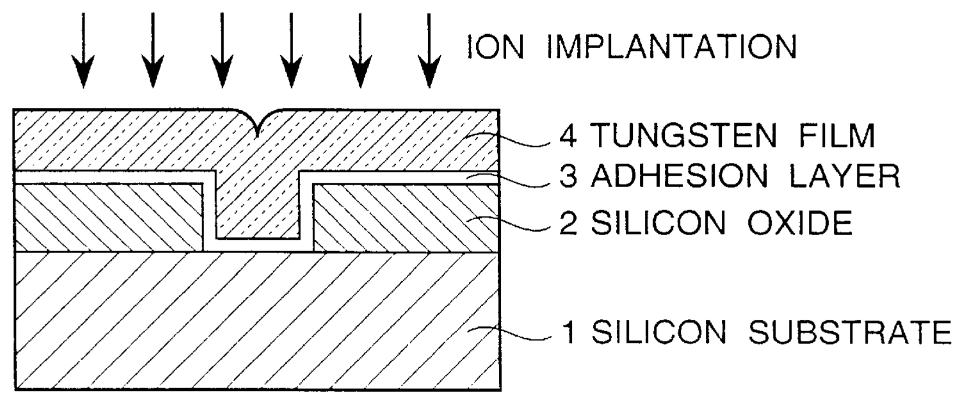

Thereafter, as shown in FIG. 4B, a material such as tungsten or molybdenum is injected into the tungsten film 4 by means of an ion implantation process. At this time, the condition for the ion implantation is that an acceleration voltage is on the order of 100 KeV to 2,000 KeV and the dose is on the order of $1\times10^{13}$ atoms/$cm^2$ to $5\times10^{14}$ atoms/$cm^2$.

If the tungsten film 4 to be ion-implanted becomes thinker, it is preferred to perform the ion-implantation with a higher energy and with a higher dose.

With the ion-implantation to the tungsten film 4, the stress of $1.2\times10^{10}$ dyne/$cm^2$ in the deposited tungsten film is reduced to the stress of $8\times10^9$ dyne/$cm^2$. As a result, there no longer occurs a problem, such as a wafer feed error, in succeeding processes such as a lithography and a dry etching which are performed after the completion of the tungsten film deposition.

Figure 6:
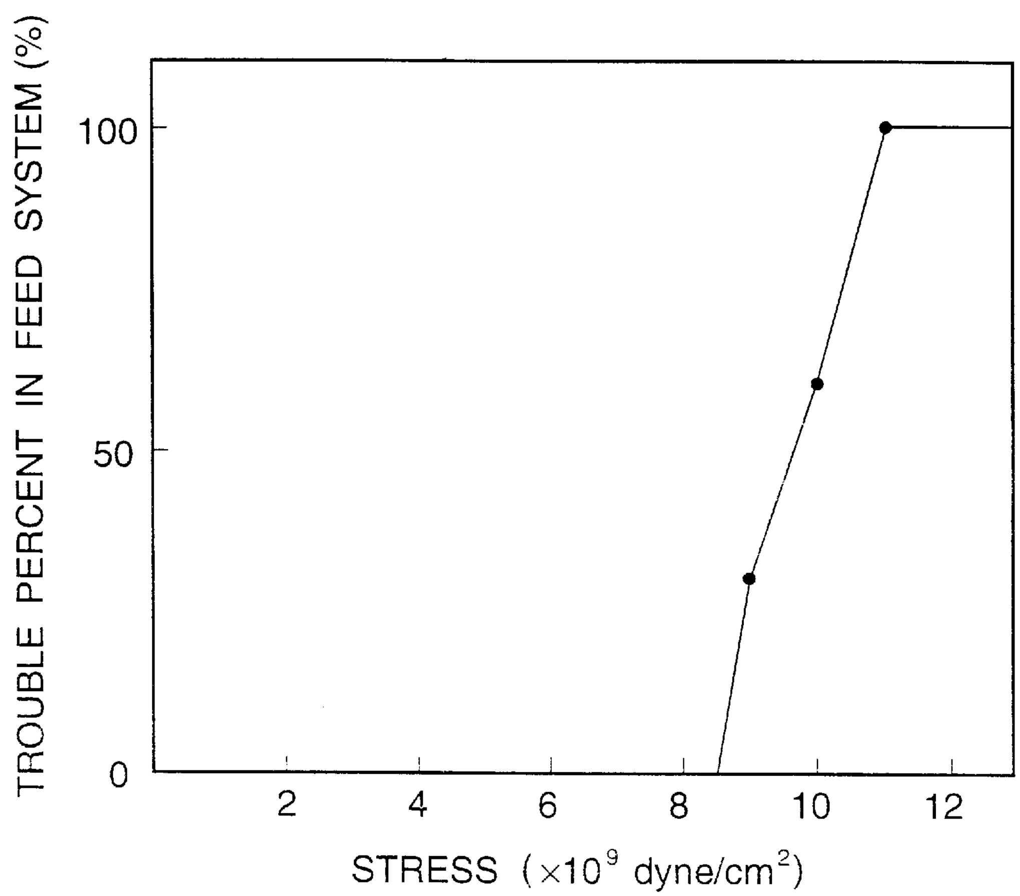
FIG. 6 is a graph illustrating a stress dependency of the feed trouble occurrence percent in the semiconductor device manufacturing machine.

Referring to FIG. 6, there is shown a graph illustrating a stress dependency of the feed trouble occurrence percent in the semiconductor device manufacturing machine. It would be understood that the feed trouble occurrence percent becomes zero according to the present invention.

Figure 4C:
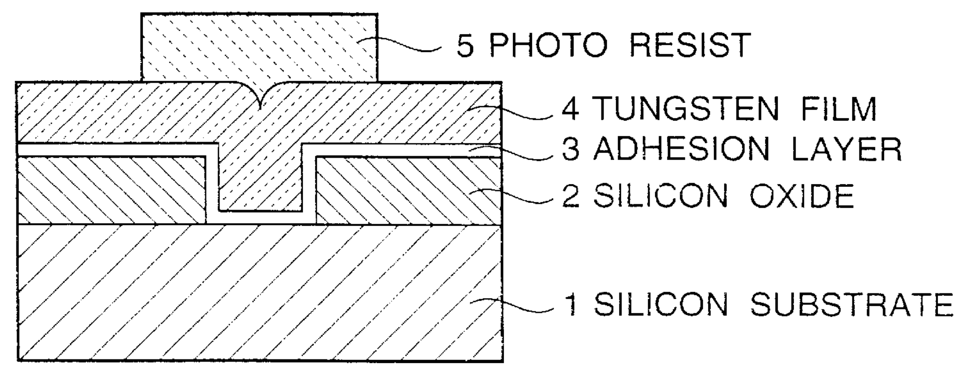
Figure 4D:
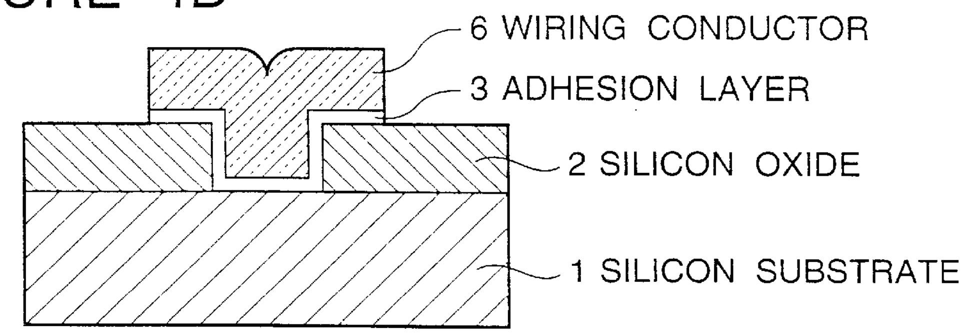

Thereafter, as shown in FIG. 4C, a photo resist mask 5 is formed on the tungsten film 4 by use of a lithography technology, and then, as shown in FIG. 4D, the tungsten film 4 and the underlying adhesion layer 3 are patterned by use of a dry etching technology so as to form a wiring conductor 6.

Thus, as mentioned above, it is possible to form a wiring conductor formed of a tungsten film used for filling a contact hole with an excellent filling property having no void, by forming the tungsten film by the CVD process and then by implanting ions into the tungsten film.

Now, a second embodiment of the present invention will be described with reference to FIGS. 7A to 7D, which are diagrammatic sectional views of a semiconductor device, for illustrating a second embodiment of the process in accordance with the present invention for manufacturing a semiconductor device.

Figure 7A:
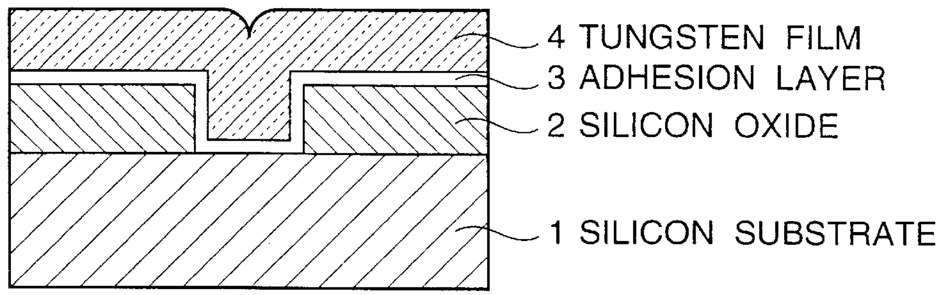
FIGS. 7A to 7D are diagrammatic sectional views of a semiconductor device, for illustrating a second embodiment of the process in accordance with the present invention for manufacturing a semiconductor device.

First, similarly to the first embodiment, a silicon oxide film 2 is formed on a silicon substrate 1, and a contact hole is formed through the silicon oxide film by use of a lithography technology and a dry etching technology, and then, an adhesion layer 3 composed of a Ti film and a TiN film is deposited by sputtering. Furthermore, a tungsten film 4 is filled into the contact hole with no void by a CVD process, as shown in FIG. 7A.

Figure 7B:
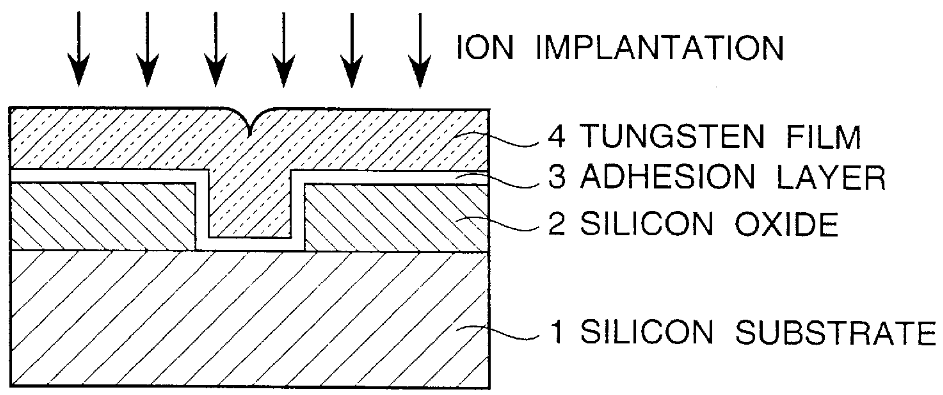
Figure 7C:
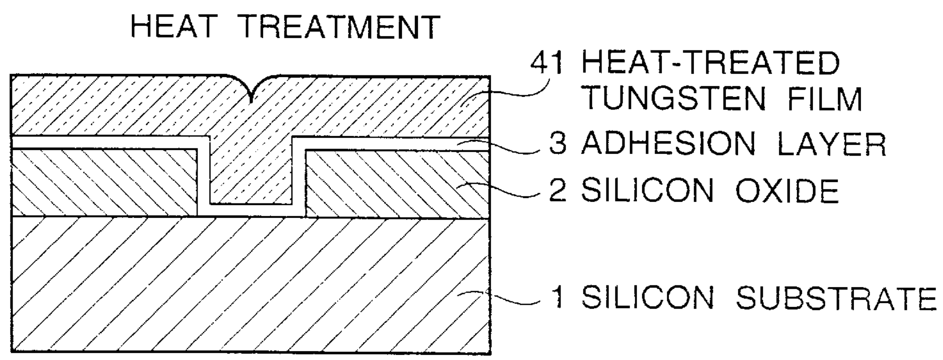

Thereafter, as shown in FIG. 7B, silicon is injected into the tungsten film 4 by means of an ion implantation process. Further, a heat treatment is performed at 500° C. to 800° C. by use of a lamp anneller or in a diffusion furnace, as shown in FIG. 7C. With this heat treatment, the tungsten and the silicon react, with the result that the stress is further reduced. Thus, a heat-treated tungsten film 41 having a reduced stress is formed.

Figure 7D:
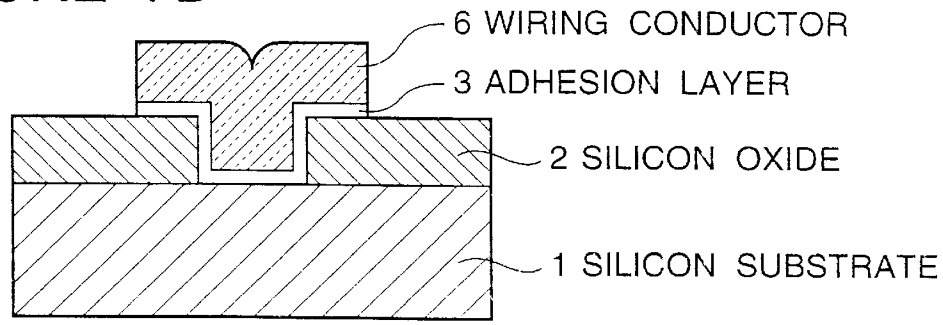

Thereafter, similarly to the first embodiment and as shown in FIG. 7D, a desired wiring conductor 6 is formed by use of a lithography technology and a dry etching technology.

As in the second embodiment, if ions such as silicon ions, which easily react with tungsten at a relatively low temperature, is injected into the tungsten film, the injected ions react with the tungsten in the succeeding heat treatment, with the result that the structure of the tungsten film changes and the stress is relaxed. Thus, the heat-treated tungsten film 41 having a low stress can be formed.

In the above mentioned first and second embodiments, the stress of the whole of the tungsten film is reduced. However, it is possible to reduce the stress in only a surface region of the tungsten film by changing the acceleration voltage and the dose of the ion implantation. In this case, the tungsten film has a double layer structure composed of a first layer portion formed by the CVD process and having a high stress, and a second layer portion having a stress reduced in accordance with the present invention. However, totally considering the whole of the tungsten film of the double layer structure, the tungsten film has a reduced stress, and therefore, can be used as the tungsten film for the wiring conductor.

In addition, the material to be ion-implanted into the tungsten film can be a refractory metal such as molybdenum or silicon, and furthermore, may be aluminum, phosphorus, boron, etc.

The heat treatment performed after the ion implantation in the second embodiment can be performed in the case of the first embodiment and in a case of ion-implanting another material.

Figure 9:
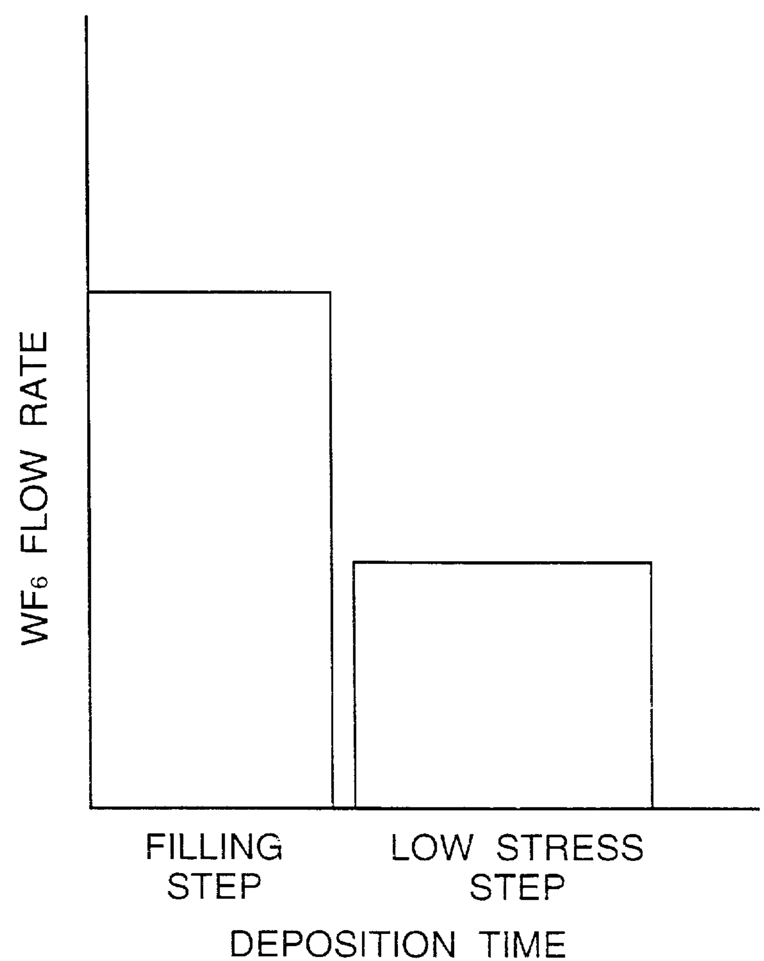
FIG. 9 is a time chart illustrating the change of the $WF_6$ flow rate in the third and fifth embodiments of the present invention.
Figure 10A:
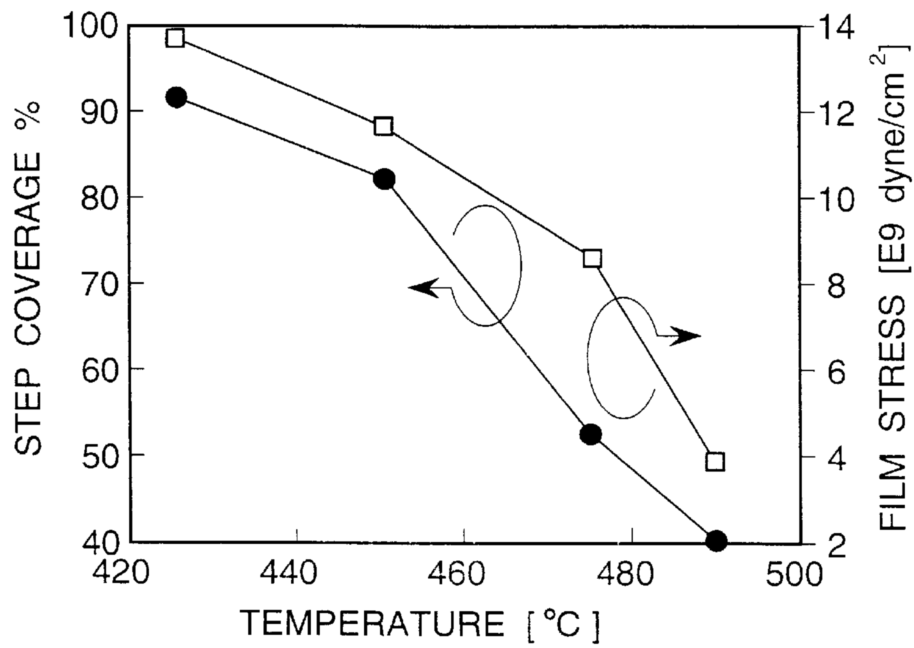
FIG. 10A is a graph illustrating a temperature dependency of the step coverage and the film stress, in the CVD process for forming the tungsten film using $WF_6$ and $H_2$ as a raw material.
Figure 10B:
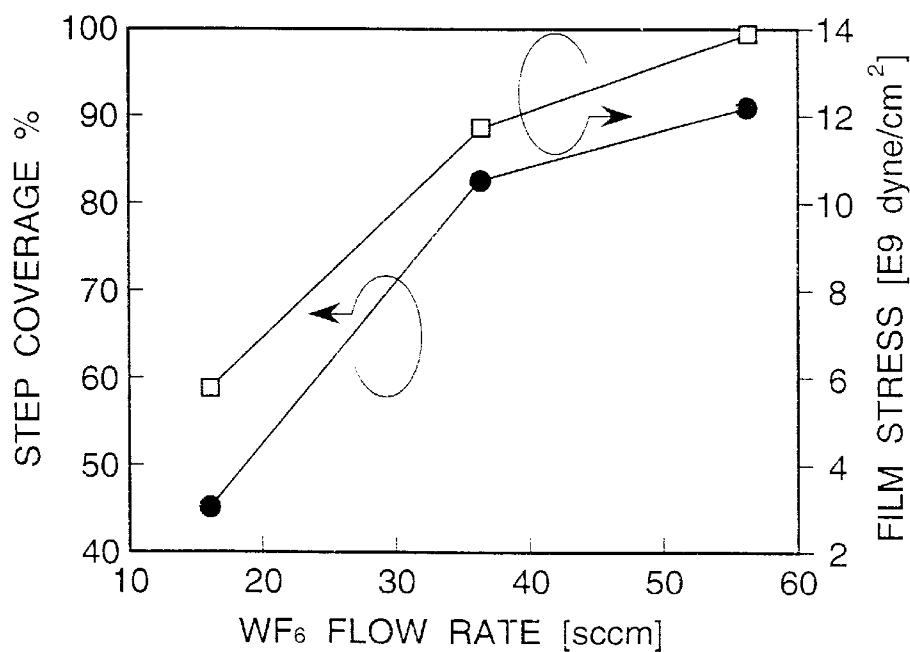
FIG. 10B is a graph illustrating a $WF_6$ flow rate dependency of the step coverage and the film stress, in the CVD process for forming the tungsten film using $WF_6$ and $H_2$ as a raw material.

Now, a third embodiment of the present invention will be described with reference to FIGS. 8A to 8D, which are diagrammatic sectional views of a semiconductor device, for illustrating the third embodiment of the process in accordance with the present invention for manufacturing a semiconductor device. In addition, FIG. 9 is a time chart illustrating the change of the $WF_6$ flow rate in the third embodiment of the present invention, and FIGS. 10A and 10B are graphs illustrating the grounds for the condition of the third embodiment. FIG. 10A is a graph illustrating a temperature dependency of the step coverage and the film stress, in the CVD process for forming the tungsten film using $WF_6$ and $H_2$ as a raw material, and FIG. 10B is a graph illustrating a $WF_6$ flow rate dependency of the step coverage and the film stress, in the CVD process for forming the tungsten film using $WF_6$ and $H_2$ as a raw material.

Figure 8A:
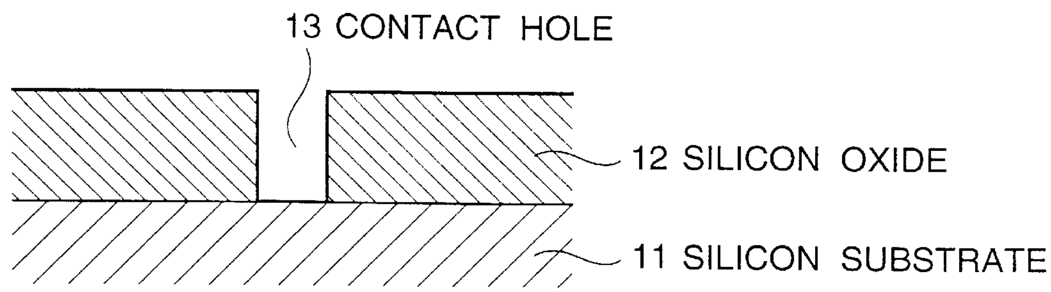
FIGS. 8A to 8D are diagrammatic sectional views of a semiconductor device, for illustrating third to sixth embodiments of the process in accordance with the present invention for manufacturing a semiconductor device.

As shown in FIG. 8A, a silicon oxide film 12 is formed on a silicon substrate 11 in which a desired circuit has been already formed, and the silicon oxide film 12 is selectively etched to form a contact hole 13 reaching a principal surface of the substrate 11.

Figure 8B:
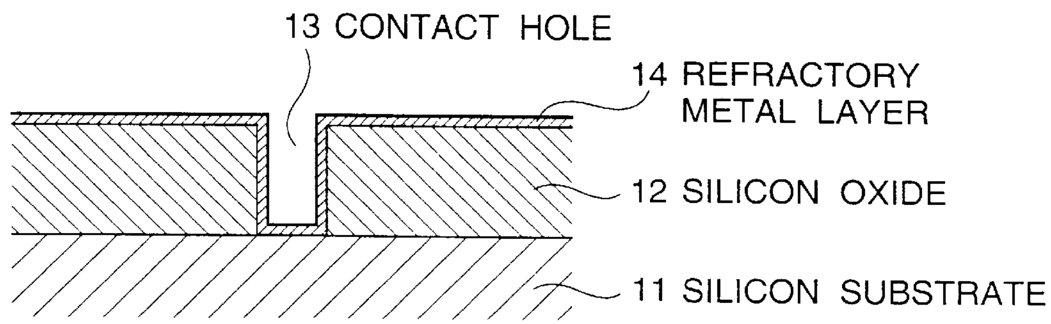

Then, as shown in FIG. 8B, a refractory metal layer 14 is deposited on the surface including the inside of the contact hole 13, by depositing a titanium film and a titanium nitride film by sputtering.

Figure 8C:
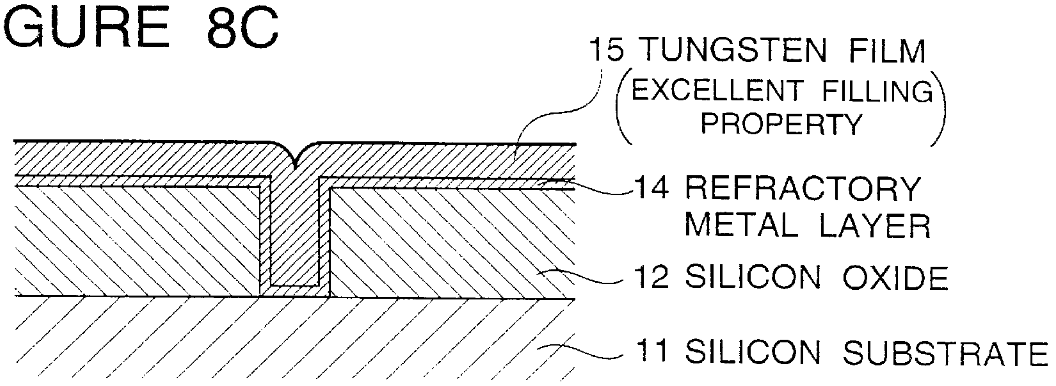

Thereafter, as shown in FIG. 8C, a tungsten film 15 is formed by a chemical vapor deposition using $WF_6$ and $H_2$ as a raw material, under a condition realizing an excellent step coverage, namely, a reaction rate controlling condition such as a deposition temperature of 400° C. to 450° C., a $WF_6$ flow rate of 50 sccm to 100 sccm and a $H_2$ flow rate of 200 sccm to 3,000 sccm. At this time, the thickness of the deposited film 15 is controlled on such a degree as to fill the contact hole 13. For example, when the contact hole having a diameter of 0.5 $\mu$m, the thickness of the deposited film is 0.2 $\mu$m or more. In other words, this tungsten film 15 has a film thickness not smaller than 40% of a diameter of the contact hole.

Figure 8D:
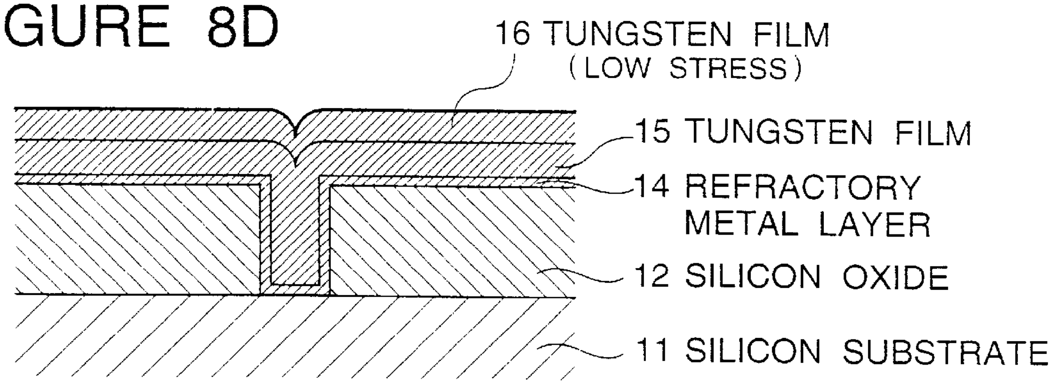

Furthermore, as shown in FIG. 9, in the same deposition chamber, a tungsten film 16 is continuously formed by the chemical vapor deposition using $WF_6$ and $H_2$ as a raw material, under a condition for forming a film having the stress lower than that of the tungsten film 15, namely, a supply rate controlling condition such as a $WF_6$ flow rate of 10 sccm to 50 sccm but maintaining the deposition temperature as it is. Thus, a metal wiring film having a desired thickness as shown in FIG. 8D is formed.

Here, referring to FIGS. 10A and 10B, in the chemical vapor deposition using $WF_6$ and $H_2$ as the raw material, the smaller the $WF_6$ flow rate is, and the higher the deposition temperature is, the smaller the internal stress of the deposited film becomes, and the worse the step coverage becomes. Accordingly, if the tungsten films 15 and 16 are continuously deposited in the above mentioned order, it is possible to deposit the metal wiring film having less void and a low internal stress.

Next, a fourth embodiment of the present invention will be described with reference to FIGS. 8A to 8D and FIG. 11 which is a time chart illustrating the change of the film deposition temperature in the fourth embodiment of the present invention.

First, as shown in FIG. 8A, a silicon oxide film 12 is formed on a silicon substrate 11 in which a desired circuit has been already formed, and the silicon oxide film 12 is selectively etched to form a contact hole 13 reaching to a principal surface of the substrate 11. Then, as shown in FIG. 8B, a refractory metal layer 14 is deposited on the surface including the inside of the contact hole 13, by a sputtering.

Thereafter, as shown in FIG. 8C, a tungsten film 15 is formed by a chemical vapor deposition using $WF_6$ and $H_2$ as a raw material, under a condition realizing an excellent step coverage, namely, a reaction rate controlling condition such as a deposition temperature of 400° C. to 450° C. and a $WF_6$ flow rate of 10 sccm to 100 sccm. At this time, the thickness of the deposited film is controlled on such a degree as to fill the contact hole 13. For example, when the contact hole having a diameter of 0.5 $\mu$m, the thickness of the deposited film is 0.2 $\mu$m or more.

Figure 11:
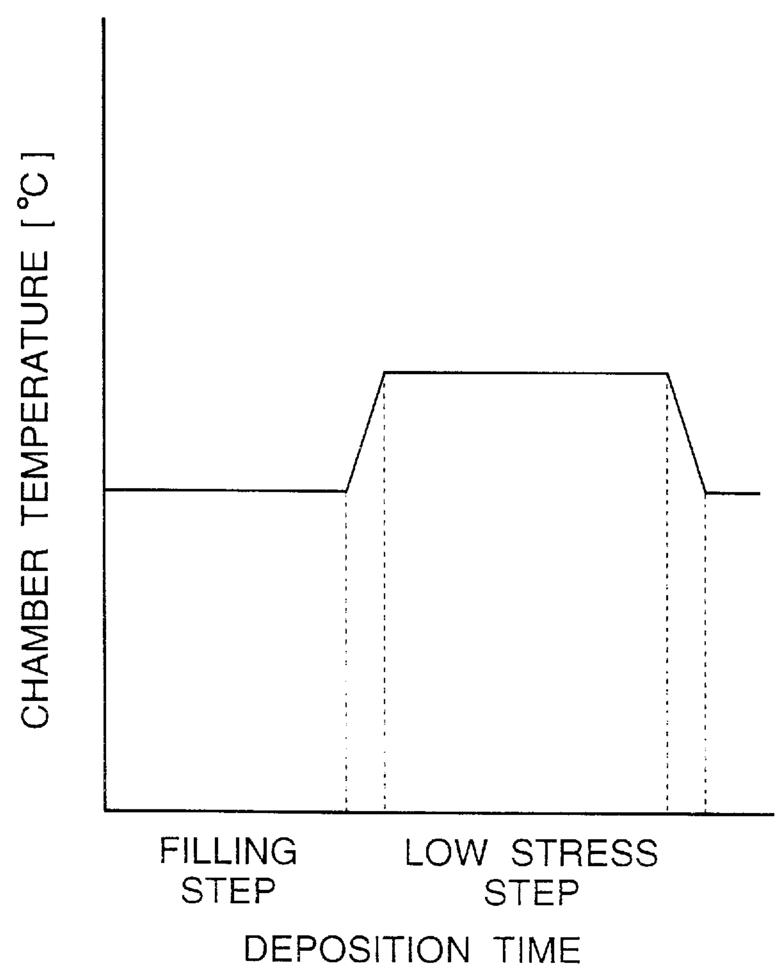
FIG. 11 is a time chart illustrating the change of the film deposition temperature in the fourth and fifth embodiments of the present invention.

Furthermore, as shown in FIG. 11, in the same deposition chamber, a tungsten film 16 is continuously formed by the chemical vapor deposition using $WF_6$ and $H_2$ as a raw material, under a condition for forming a film having the stress lower than that of the tungsten film 15, namely, a supply rate controlling condition such as a deposition temperature of 450° C. to 500° C. but maintaining the $WF_6$ flow rate as it is. Thus, a metal wiring film having a desired thickness as shown in FIG. 8D is formed.

Further, a fifth embodiment of the present invention will be described. First, as shown in FIG. 8A, a silicon oxide film 12 is formed on a silicon substrate 11 in which a desired circuit has been already formed, and the silicon oxide film 12 is selectively etched to form a contact hole 13 reaching to a principal surface of the substrate 11. Then, as shown in FIG. 8B, a refractory metal layer 14 is deposited on the surface including the inside of the contact hole 13, by a sputtering.

Thereafter, as shown in FIG. 8C, a tungsten film 15 is formed by a chemical vapor deposition using $WF_6$ and $H_2$ as a raw material, under a condition realizing an excellent step coverage, namely, a reaction rate controlling condition such as a $WF_6$ flow rate of 50 sccm to 100 sccm and a deposition temperature of 400° C. to 450° C. At this time, the thickness of the deposited film is controlled on such a degree as to fill the contact hole 13. For example, when the contact hole having a diameter of 0.5 $\mu$m, the thickness of the deposited film is 0.2 $\mu$m or more.

Furthermore, as shown in FIGS. 9 and 11, in the same deposition chamber, a tungsten film 16 is continuously formed by the chemical vapor deposition using $WF_6$ and $H_2$ as a raw material, under a condition for forming a film having the stress lower than that of the tungsten film 15, for example a $WF_6$ flow rate of 10 sccm to 50 sccm and a deposition temperature of 450° C. to 500° C. Thus, a metal wiring film having a desired thickness as shown in FIG. 8D is formed.

Figure 12:
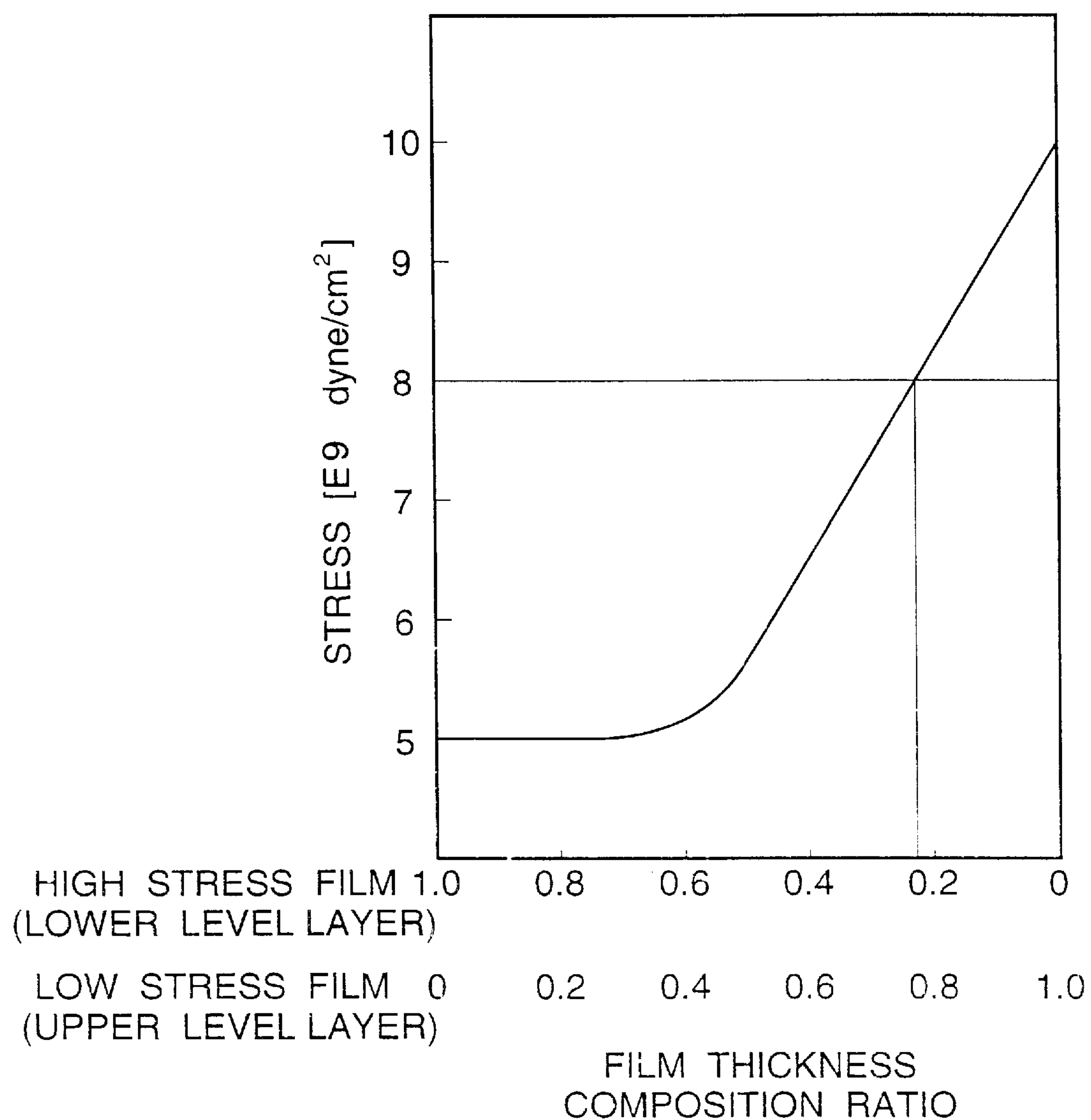
FIG. 12 is a graph illustrating a relation between the stress of the overall film and the ratio in film thickness between two films having different stresses.
Figure 13:
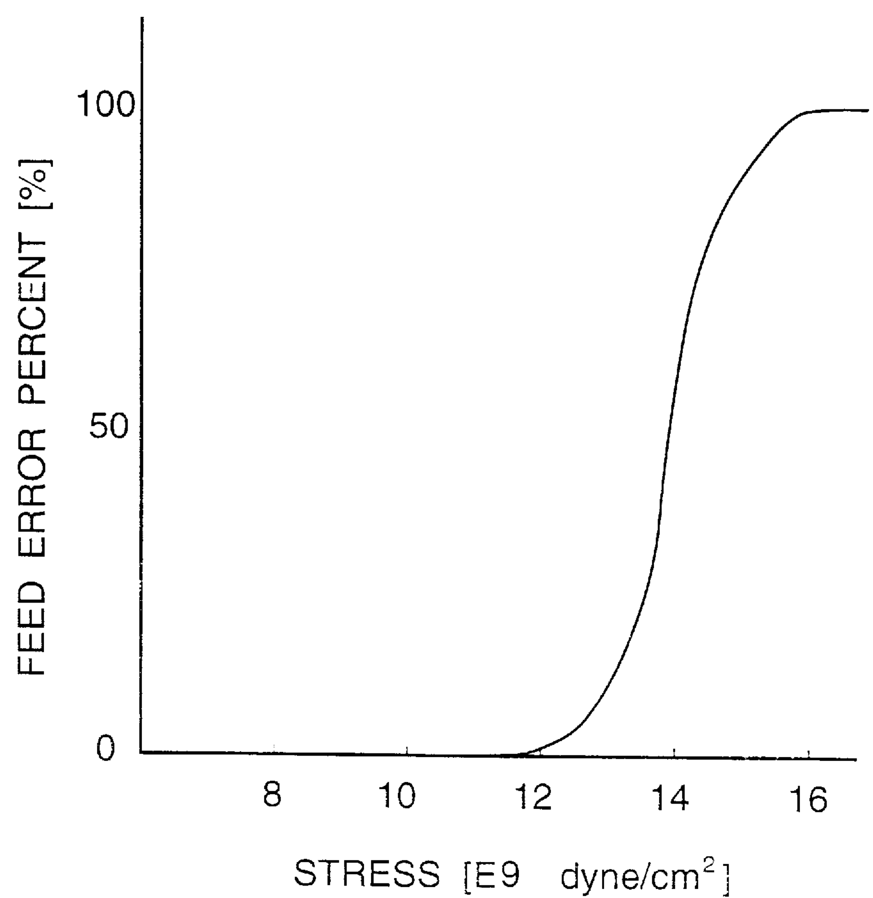
FIG. 13 is a graph illustrating a relation between the film stress and the feed error percent.

Now, a sixth embodiment of the present invention will be described with reference to FIGS. 12 and 13. FIG. 12 is a graph illustrating a relation between the stress of the overall film and the ratio in film thickness between two films having different stresses, in the sixth embodiment, and FIG. 13 is a graph illustrating a relation between the film stress and the feed error percent, for the purpose of explaining the ground for giving a target or desired film stress.

Similarly to the third embodiment, as shown in FIG. 8A, a silicon oxide film 12 is formed on a silicon substrate 11 in which a desired circuit has been already formed, and the silicon oxide film 12 is selectively etched to form a contact hole 13 reaching to a principal surface of the substrate 11. Then, as shown in FIG. 9B, a refractory metal layer 14 is deposited on the surface including the inside of the contact hole 13, by a sputtering.

Thereafter, as shown in FIG. 8C, a lower level tungsten film 15 having an excellent step coverage, similarly to the third and fourth embodiments, for example, having a stress of 10E9 dyne/cm$^2$ to 15E9 dyne/cm$^2$, and an upper level tungsten film 16 having the stress lower than that of the tungsten film 15, for example, having a stress of 15E9 dyne/cm$^2$ to 10E9 dyne/cm$^2$, are continuously deposited by a chemical vapor deposition using $WF_6$ and $H_2$ as a raw material. Thus, a metal wiring film having a desired thickness as shown in FIG. 8D is formed.

Here, as shown in FIG. 12, it is possible to control the stress of the whole of the combined tungsten films 15 and 16, by changing the film thickness ratio between the tungsten film 15 and the tungsten film 16, namely, by changing the respective deposition times of the tungsten film 15 and the tungsten film 16. For example, if the tungsten film 15 having a stress of 10E9 dyne/cm$^2$ and the tungsten film 16 having a stress of 5E9 dyne/cm$^2$ are combined, it is possible to obtain a desired stress in the range of 5E9 dyne/cm$^2$ to 10E9 dyne/cm$^2$. Therefore, if it is necessary to maintain the stress of the whole of the tungsten film at a value not greater than 8E9 dyne/cm$^2$ ($8\times10^9$ dyne/cm$^2$) as shown in FIG. 13 for the purpose of avoiding the suction failure in the same chamber in the steps after the tungsten film deposition step or in a vacuum suction type robot feeding for going to other succeeding steps, it is sufficient if the lower level tungsten film 15 is made not greater than 70% in the film thickness ratio.

In the above mentioned embodiment, the tungsten film 15 and the tungsten film 16 are continuously formed in the same chamber. However, the continuous formation is not indispensable. The tungsten film 15 and the tungsten film 16 can be formed in different chambers or in different deposition machines, or in the chemical vapor deposition and the sputtering, respectively.

As seen from the above, according to the present invention, it is possible to form the tungsten film having an excellent filling property by use of the CVD process, and then to implant ions into the tungsten film so as to reduce the stress of the tungsten film. Thus, the tungsten film having the reduced stress can be used for forming the wiring conductor.

As mentioned hereinbefore, the stress of the deposited tungsten film in accordance with the prior art was as high as $1.2\times10^{10}$ dyne/cm$^2$, and therefore, the wafer itself had a large bowing, so that such a trouble had frequently occurred that the feeding of the wafer stops in the feeding system of the semiconductor device manufacturing machine. However, the present invention can eliminate this trouble in the feeding system, and can form a patterned wiring conductor of tungsten without trouble.

Furthermore, since the present invention can reduce the stress of the tungsten film, it is possible to increase the film thickness of the tungsten film which is used as the wiring conductor.

In addition, as mentioned above, the present invention is characterized in that, in a semiconductor device having a metal wiring film, when the metal wiring film is formed, the film deposition is carried out firstly under a condition for giving an excellent step coverage, and continuously under a condition for giving a low film stress. With this characteristics, no void occurs in the contact, and therefore, a long-term reliability of the wiring can be ensured. In addition, since the wiring structure having a low internal stress can be obtained, the bowing of the wafer can be reduced, so that the feeding error in succeeding steps can be reduced.

Figure 1A:
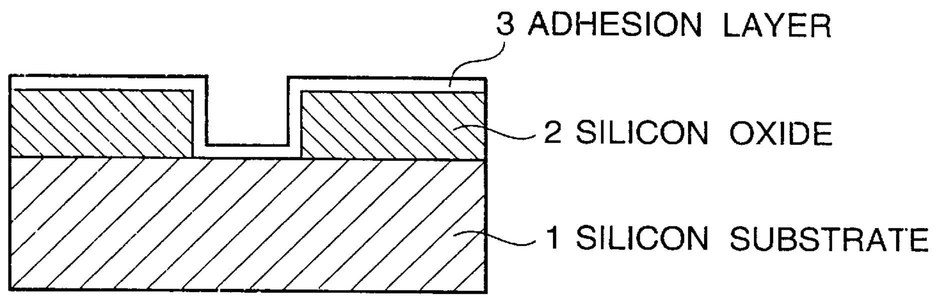
FIGS. 1A to 1D are diagrammatic sectional views of a semiconductor device, for illustrating a conventionally proposed method of forming a wiring conductor itself by the tungsten film, in order to omit the step of etching back the tungsten film.
Figure 1B:
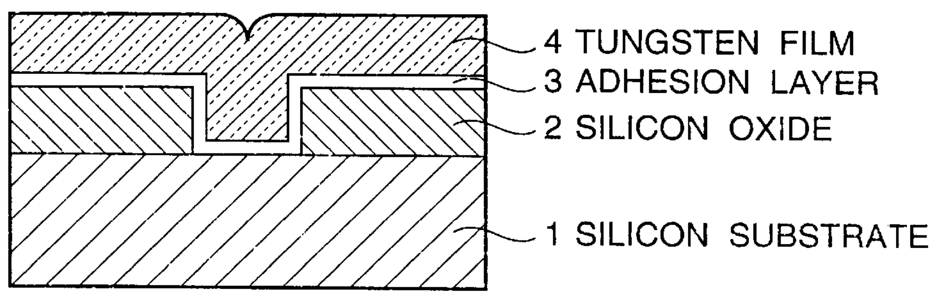
Figure 1C:
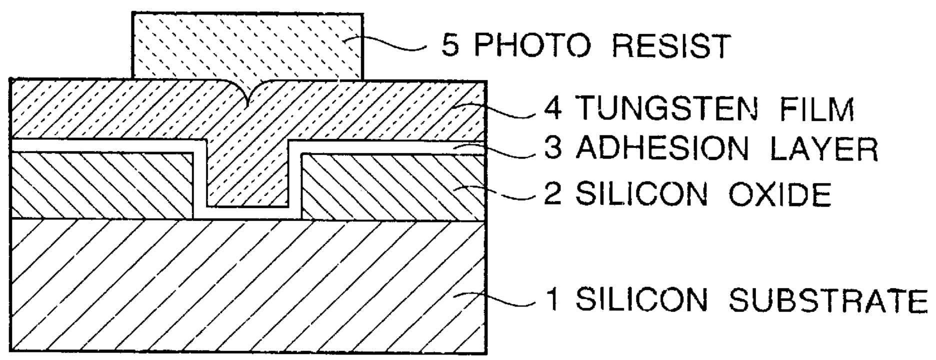
Figure 1D:
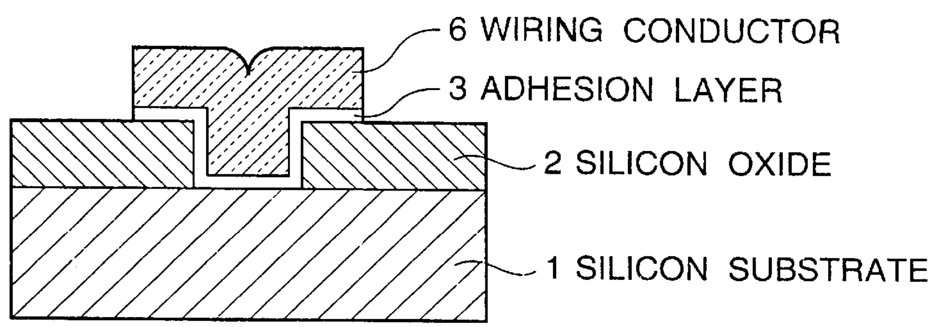
Figure 2A:
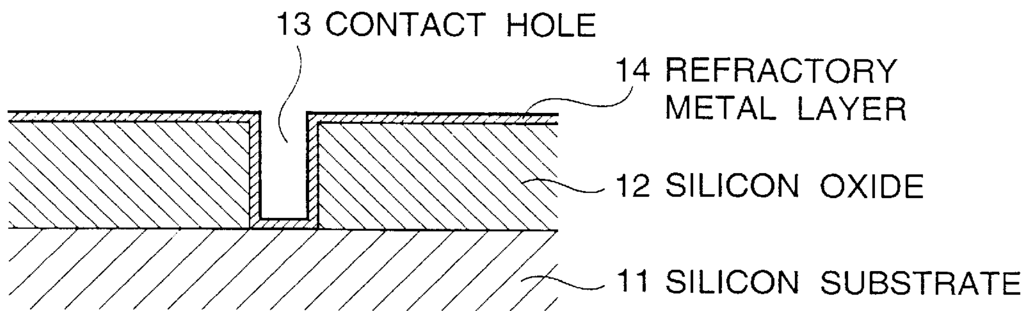
FIGS. 2A to 2D are diagrammatic sectional views of a semiconductor device, for illustrating a different conventionally proposed method of forming a tungsten contact plug and a wiring conductor by an aluminum.
Figure 2B:
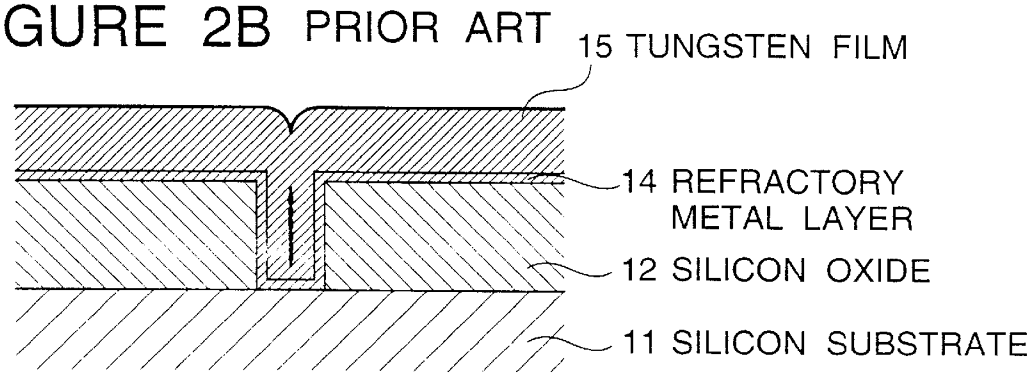
Figure 2C:
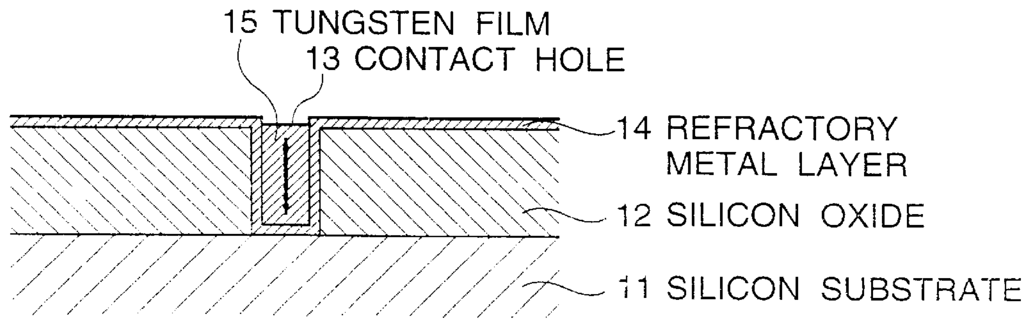
Figure 2D:
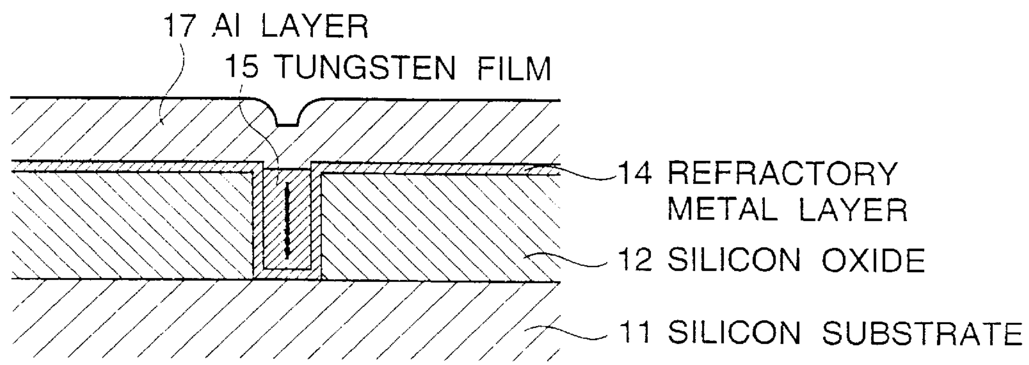
Figure 3A:
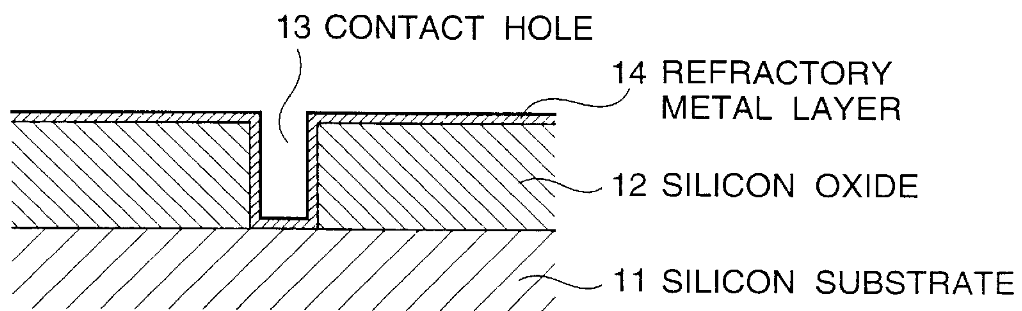
FIGS. 3A and 3B are diagrammatic sectional views of a semiconductor device, for illustrating a conventionally proposed method of forming a wiring conductor itself by the tungsten film, by changing the CVD film deposition condition of a tungsten film to a condition for forming a film having a low internal stress.
Figure 3B:
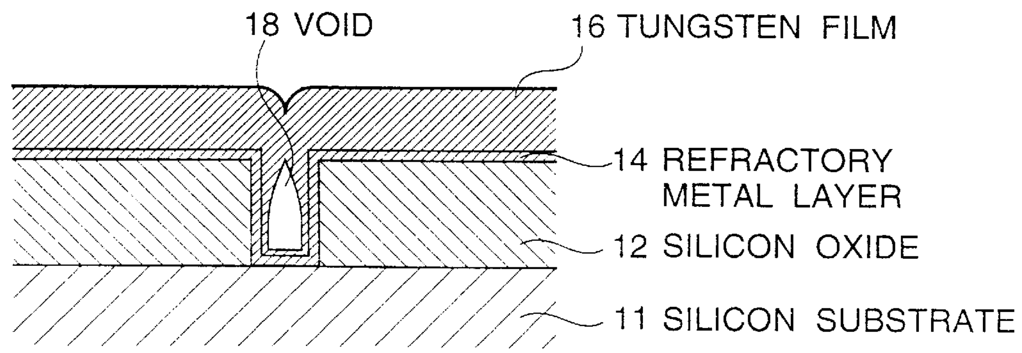

Moreover, the etching back of the tungsten film 15 as shown in FIG. 2C and the formation of the aluminum film 17 as shown in FIG. 2D, which were required in the prior art, can be omitted. Therefore, the number of steps can be reduced, and accordingly, the manufacturing cost can be correspondingly reduced.

Additionally, by changing the film thickness ratio between two metal films having different stresses, it is possible to control the stress of the whole of the metal film to a desired value between the different stresses of the two metal films.

The invention has thus been shown and described with reference to the specific embodiments. However, it should be noted that the present invention is in no way limited to the details of the illustrated structures but changes and modifications may be made within the scope of the appended claims.

We claim:

1. A method for forming a semiconductor device having a wiring conductor formed of tungsten, the method including the steps of forming a tungsten film by a low pressure chemical vapor deposition, injecting ions into said tungsten film, and patterning said ion-injected tungsten film so as to form a wiring conductor composed of said ion-injected tungsten film.

2. A method claimed in claim 1, further including the step of heat treating said ion-injected tungsten film before said patterning step.

3. A method claimed in claim 2 wherein an internal stress of said tungsten film is reduced to a value not greater than $8\times10^9$ dyne/cm$^2$ by said ion injection and said heat treatment.

4. A method claimed in claim 1 wherein an internal stress of said tungsten film is reduced to a value not greater than $8\times10^9$ dyne/cm$^2$ by said ion injection.

* * * * *